(12) United States Patent
Kano et al.

(10) Patent No.: US 6,269,048 B1
(45) Date of Patent: Jul. 31, 2001

(54) SEMICONDUCTOR MEMORY DEVICE FOR INPUTTING/OUTPUTTING DATA THROUGH A COMMON TERMINAL AND OUTPUTTING DATA IN SYNCHRONISM WITH CLOCK

(75) Inventors: Hideki Kano; Shinichi Yamada; Satoru Saitoh, all of Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/515,508

(22) Filed: Feb. 29, 2000

(30) Foreign Application Priority Data

Apr. 28, 1999 (JP) .................................................. 11-121629

(51) Int. Cl.$^7$ ...................................................... G11C 8/00
(52) U.S. Cl. ...................... 365/233; 365/230.03; 365/194
(58) Field of Search ............................. 365/233, 230.03, 365/194, 221

(56) References Cited

U.S. PATENT DOCUMENTS

| 5,311,483 | * | 5/1994 | Takasugi ................................. 365/233 |
| 5,402,389 | * | 3/1995 | Flannagan et al. ................... 365/233 |
| 5,666,321 | * | 9/1997 | Schaefer ............................. 365/233.5 |
| 6,005,825 | * | 12/1999 | Lee et al. ............................. 365/233 |

\* cited by examiner

*Primary Examiner*—David Nelms
*Assistant Examiner*—Gene N. Auduong
(74) *Attorney, Agent, or Firm*—Arent Fox Kintner Plotkin & Kahn, PLLC

(57) ABSTRACT

A semiconductor memory device, in which the output is restored to high impedance state and capable of operating always normally even when a prohibited command is input thereto, is disclosed. The device has a common terminal for data input and output, and data are output in synchronism with a clock. The device further comprises an output clock generating circuit for generating a clock in accordance with the output period of the output data, and an output circuit for producing the output data in accordance with the clock. The output clock generating circuit is turned off after generating an additional two cycles of the clock following the end of the production of the output data.

5 Claims, 13 Drawing Sheets

SEMICONDUCTOR MEMORY DEVICE FOR INPUTTING/OUTPUTTING DATA THROUGH A COMMON TERMINAL AND OUTPUTTING DATA IN SYNCHRONISM WITH CLOCK

BACKGROUND OF THE INVENTION

The present invention relates to a semiconductor storage device (memory) for inputting/outputting data through a common terminal and outputting data in synchronism with clock or, in particular, to a synchronous dynamic random access memory (SDRAM), comprising a plurality of banks of memory cells, for performing an internal operation in synchronism with the clock generated from an external clock source and outputting data in synchronism with the clock.

A DRAM with a high-speed page mode is used as a main memory for the computer. Various DRAMs intended for higher speed have been proposed. An asynchronous DRAM, for example, includes an EDO (extended data out) mode or a burst EDO mode improved from the high-speed page mode, while a synchronous DRAM includes a SDRAM. The invention relates to a synchronous memory, or in particular to a SDRAM. An explanation will be given below with reference to the SDRAM.

FIG. 1 is a block diagram showing a general configuration of a SDRAM. As shown in FIG. 1, a DRAM core having an array of memory cells is configured with four banks 11-0 to 11-3. This configuration with a plurality of banks is intended to improve the data transfer rate by employing a method called interleaving for accessing the banks on rotation. A clock buffer 21 generates an internal clock clkz in response to an external clock, and supplies the internal clock to various parts. Each part operates in synchronism with the internal clock clkz. A command decoder 22 generates a signal used for internal control from the external control signals such as a chip select signal (/CS), /RAS, /CAS, /WE supplied from an external source. An address buffer 23 is a circuit for receiving an address signal Add input from an external source. A bank select circuit 24 is for generating a bank select signal bnk#z from a portion of the address signal Add. A control signal generating circuit 25 generates a control signal applied to the banks based on the control signal from the command decoder 22 and the bank select signal bnk#z. The SDRAM has various operation modes, one of which is designated by the address signal under a predetermined state of the external control signal. A mode register 26 stores this address signal and outputs a signal indicating a mode. A row address constituting a part of the address signal is supplied directly as a row address of the bank. In the SDRAM, a predetermined number of words (burst length) are continuously read from a given address. Column address counters 27, 28 receive the remaining column addresses of the address signal, generate continuous column addresses at high speed and supply them as the column addresses of the bank at the time of the read operation according to the prevailing mode. A burst length control circuit 29 performs the control operation for reading the data of burst length continuously in burst mode. A latency control circuit 30 is for controlling the /CAS latency (CL). CL is the number of clocks from the input of /CAS to the time when the first data is read, and can be designated in the SDRAM. The latency control circuit 30 performs the control operation for starting the data output with a designated CL.

A column bank status signal generating circuit 31 generates a column bank status signal cras#z indicating whether the column signal is activated or not based on the internal activation signal actpz generated by a command decoder 22 and the bank select signal bnk#z (# indicates the bank number as in the following description). A read status signal generating circuit 32, on the other hand, generates a read status signal readz in accordance with the latency signal lq#z which is in turn generated in accordance with the burst length and CL. A column activation signal generating circuit 33 generates an output period signal csex indicating the period during which an output clock outpz is generated from the signals cras#z and readz. An output clock buffer 34 generates an output clock outpz from the signal csex and the clock CLK input from an external source. A FIFO 35 is a part for temporarily holding the data read from the banks, and an output circuit 36 sequentially outputs the data held in the FIFO 35, in accordance with the output clock outpz. An output DQ is output to the same terminal by way of which the write data is input, and therefore the output of the output circuit 36 assumes a high impedance (Hi-Z) status upon complete output of the data.

A general configuration of the SDRAM was described above. The configuration will not be described in more detail, except for the parts related to the invention which include the column banks status signal generating circuit 31, the read status signal generating circuit 32, the column activation signal generating circuit 33, the output clock buffer 34, the FIFO 35 and the output circuit 36, and which will be described below with reference to the drawings.

FIG. 2 is a circuit diagram showing the column bank status generating circuit 31. As described above, the signal actpz is an internal activation signal generated by the command decoder 22, the signal bnk#z is a bank select signal, the signal apre#x is a signal related to an auto precharge command, and the signal dacpz is called a PRE and PALL command signal which is used for the reset operation with the signal a10z. The column bank status signal cras#z output from this circuit is activated by receiving the signals actpz and bnk#z and continues to be output during the bank active period. In the case of a command with auto precharge, a pulse for reducing the signal apre#x to a "low" state is output upon complete reading of a burst, by an interrupt of the burst or an interrupt by accessing other banks. Then, the latch is inverted for resetting.

When interrupted by a write command into a different bank in the read operation with a precharge, though a command input not permitted, the signal apre#x becomes "low" and so does the signal cras#z. At the same time, the signals cras#z of other banks also become "low".

FIG. 3 is a circuit diagram of the read status signal generating circuit 32, and FIG. 4 is a time chart showing the operation of the same circuit. A signal cmcpz is a clock for columns, a signal sttx is for resetting the device at the time of starting, and a signal wrtcz becomes "high" when the write command is input. Only the signal lq0z is output when CL is 2, and the signals lq0z and lq1z are output when CL is 3. The signals lq0z, lq1z have a period "high" as long as the burst length, and the rise timing thereof corresponds to the CL, respectively. When CL is 2, the read status signal readz output becomes "high" in response to the rise of the signal lq0z, which is delayed by one clock in a D-type flip-flop 40, and the signal readz becomes "low" with the fall of the signal lq0z. When CL is 3, on the other hand, the signal readz becomes "high" in response to the rise of the signal lq0z, and the signal lq1z is delayed by one clock in the D-type flip-flop 40, so that the signal readz becomes "low" with the fall thereof. Thus, the read status signal readz is a signal indicating a period longer by one clock than the data output period.

FIG. 5 is a diagram showing a circuit configuration of the FIFO circuit 35. In the SDRAM, data are read by pipelining, while the data are output in synchronism with the clock. For this purpose, the FIFO circuit 35, in which the data read out from the banks are temporarily stored and data are read out in the order of storage in synchronism with the clock, is provided. The signal rdrv#z designates a read data bus drive signal, and the signal ird#x/z is a read data. An input pointer counter 41 resets all the input pointers to "low" and the counter to 0 when the read status signal readz is "low". When the signal readz is "high", on the other hand, the pointer is enabled. The output pointer counter 42, on the other hand, is reset to 0 when the signal readz is "low", and when the signal readz becomes "high", the counter is enabled, so that the count changes with the trailing edge of the output clock outpz as a trigger. The output pointer signal generating circuit 43 is a select signal generating circuit for the data latched in a data latch 45, and outputs a signal po#z in accordance with the signal poen#z output from the output pointer counter 42. The data mask is also controlled by this output pointer signal generating circuit 43. The data reset circuit 44 resets the data latched in the data latch 45. When the signal readz is "high", the data reset circuit is enabled. The data latch circuit is the one for the FIFO. The read data ird#x/z is input to the latch circuit selected by the pointer signal pi#z. Upon complete drive of the read data ird#x/z, the pointer is switched, and the next data is input to the next latch circuit. Upon complete output of the data latched in the latch circuit, the data reset signal drst#x resets the latch circuit. The output control circuit 46 transfers the data dl#x/z selected by the output pointer signal po#z to the output circuit 36 while the output clock outpz is "high".

With the configuration described above, the FIFO circuit 35 temporarily stores the data read out of the banks and sequentially outputs them. Upon complete data output, a high impedance signal is output such that the output of the output circuit 36 assumes a high impedance (Hi-Z).

FIG. 6 is a circuit diagram of the column activation signal generating circuit 33. As shown in FIG. 6, this circuit outputs a column activation signal csex which is valid while the column bank status signal cras#z or the read status signal readz are active. Thus, the signal csex is validated earlier than the signal readz and invalidated at the same time as the signal readz. Specifically, the signal csex is validated earlier than the data output period, and invalidated one clock cycle after the end of the data output period.

FIG. 7 is a circuit diagram of the output clock buffer circuit 34. This circuit generates an output clock outpz from the clock CLK input from an external source, while the column activation signal csex remains valid. Thus, the output clock outpz is generated earlier than the data output period, and outputs one extra pulse after the end of the data output period.

FIG. 8 is a circuit diagram of the output circuit 36. The output from the FIFO circuit 35 is output as two sets of complementary signals pue00z, pue00x and pde00z, pde00x. In the case where the output data DQ becomes "high", for example, the signals pue00z, pde00z are "high" while the signals pue00x, pde00x are "low". In the case where the output data DQ is "low", on the other hand, the signals pue00z, pde00z are "low" while the signals pue00x, pde00x are "high". Further, the impedance of the output data DQ is increased, i.e. the high impedance data is obtained in the case where the signals pde00z, pue00x are "high" while the signals pue00z, pde00x are "low". The output data or the high impedance data are set as the signals pue00z, pue00x and the signals pde00z, pde00x, respectively. With two flip-flops thus assuming the state corresponding to each other, the status of the output DQ is changed in accordance with the leading edge of the output clock outpz, and the status of the output DQ is determined in accordance with the trailing edge of the signal outpz. Thus, even in the case where the signals pue00z, pue00x and pde00z, pde00x are set, the status of the output DQ remains unchanged unless the signal outpz is input.

As described above, the output clock outpz is generated earlier than the data output period, and at the end of the data output period, one extra pulse is output. If the high impedance data is output after all the output data are produced from the FIFO circuit 35, therefore, the output DQ assumes a high impedance. The FIFO circuit 35 continues to output the high impedance data until the next data output. Even in the case where the data output clock outpz is generated after the end of the data output, therefore, the output DQ of the output circuit 36 is maintained in high impedance state. If the output clock is produced during the time when no output is produced, however, the current consumption increases correspondingly. For this reason, as described above, the output clock outpz is not generated after an extra pulse following the end of the data output period.

In the configuration described above, the output DQ is adapted to assume a high impedance after the end of the data output, and operates normally without any problem. The specification of the SDRAM is so determined that in the case where the data is written after being read in burst mode, the external control signal is set in predetermined state while inputting the write data after the output DQ becomes a high impedance. Thus, the inputting of a write command immediately after the read operation is prohibited.

As long as the power condition is unstable such as at the time of turning power on, however, it may be determined by the command decoder 22 that the write command is input immediately after the read operation. Also, in spite of the specification described above, such a command may be input by error. In such a case, if the destination of the write operation is a different bank, the generation of the output clock is stopped, leading to the problem that the output DQ fails to assume a high impedance. FIG. 9 is a diagram for explaining this problem.

The bank 0 is activated, and the signal cras0z rises, while the column activation signal csex falls to "low". Correspondingly, the generation of the output clock outpz is started. After that, the column address counter for the read operation with auto precharge is operated and the read status signal readz rises to "high" and becomes valid. If a write command to the bank 3 occurs before the end of the read operation, all the column bank status signals cras#z also fall to "low" due to the auto precharge. Also, since the write command is input, the read status signal readz falls to "low" and is deactivated. As a result, the column activation signal csex becomes "high". With the data output, the generation of the output clock is stopped, so that the output DQ is not restored to high impedance, thus maintaining the state in which the data is output.

In the normal system, the device is initialized by inputting a reset command after turning power on. Even this process cannot restore the device output to high impedance state and the problem is posed that the system cannot be operated normally.

SUMMARY OF THE INVENTION

The present invention is intended to solve the above-mentioned problems, and the object thereof is to provide a semiconductor memory device in which the output is restored to high impedance even when a prohibited command is input, thereby always securing a normal operation.

In order to achieve the object described above, according to the present invention, there is provided a semiconductor memory device in which one more extra pulse of the output clock is generated, compared to the prior art, regardless of the command set to enable the output circuit to produce a high impedance data.

Specifically, the semiconductor memory device according to the invention comprises a common terminal for inputting/outputting data and producing data in synchronism with the clock, an output clock generating circuit for generating a clock in accordance with the output period of the output data, and an output circuit for producing the output data in accordance with the clock, wherein the output clock generating circuit is turned off after additional two cycles of clock generation following the end of the output data.

In the prior art, an extra output clock is generated only for one cycle after the end of the output of the output data. As a result, in the case where a write command is input immediately after the read operation, the generation of the output clock is stopped before the output circuit outputs a high impedance data and assumes a high impedance, with the result that the output circuit fails to assume a high impedance. According to the present invention, in contrast, the output clock for one extra cycle compared with the prior art described above, i.e. the clock having two extra cycles in all is always generated, so that even in such a case as mentioned above, the output circuit always outputs a high impedance data and assumes a high impedance. Since the output clock is generated for one extra cycle as compared with the prior art, the current consumption is increased. Nevertheless, the saving of current consumption is still considerable.

A semiconductor memory device according to this invention, as described above, comprises a read status signal generating circuit for generating a read status signal corresponding to the output data period with the end time point thereof extended by one extra clock cycle, a FIFO circuit for holding the output data temporarily during the valid period of the read status signal, applying the output data to the output circuit and producing a high impedance data for raising the output of the output circuit to a high impedance status, and an activation signal generating circuit for generating an active signal with the data output period having an end time point extended, like the read status signal, by one clock cycle from the read status signal and the access signal to the memory cells of the semiconductor memory device.

The output clock generating circuit includes an extension circuit for extending the active signal by one clock cycle, wherein a clock is generated while the output of the extension circuit is valid, and therefore the clock is generated for two extra clock cycles after the end of the production of the output data.

Also, the output clock generating circuit includes a clock generating circuit for generating a clock as long as the active signal is valid, and a delay circuit for delaying the generated clock by one extra cycle, wherein the output of the delay circuit is supplied as a clock to the output circuit.

The semiconductor memory device according to the invention is a synchronous dynamic random access memory (SDRAM) having a plurality of banks of memory cells, for example, and the access signal is a bank activation signal generated for accessing any one of a plurality of the banks.

BRIEF DESCRIPTION OF THE DRAWINGS

The feature and advantages of the invention will be more clearly understood from the following description taken in conjunction with the accompanying drawings, in which.

DESCRIPTION OF THE PREFERRED EMBODIMENTS

Figure 10:
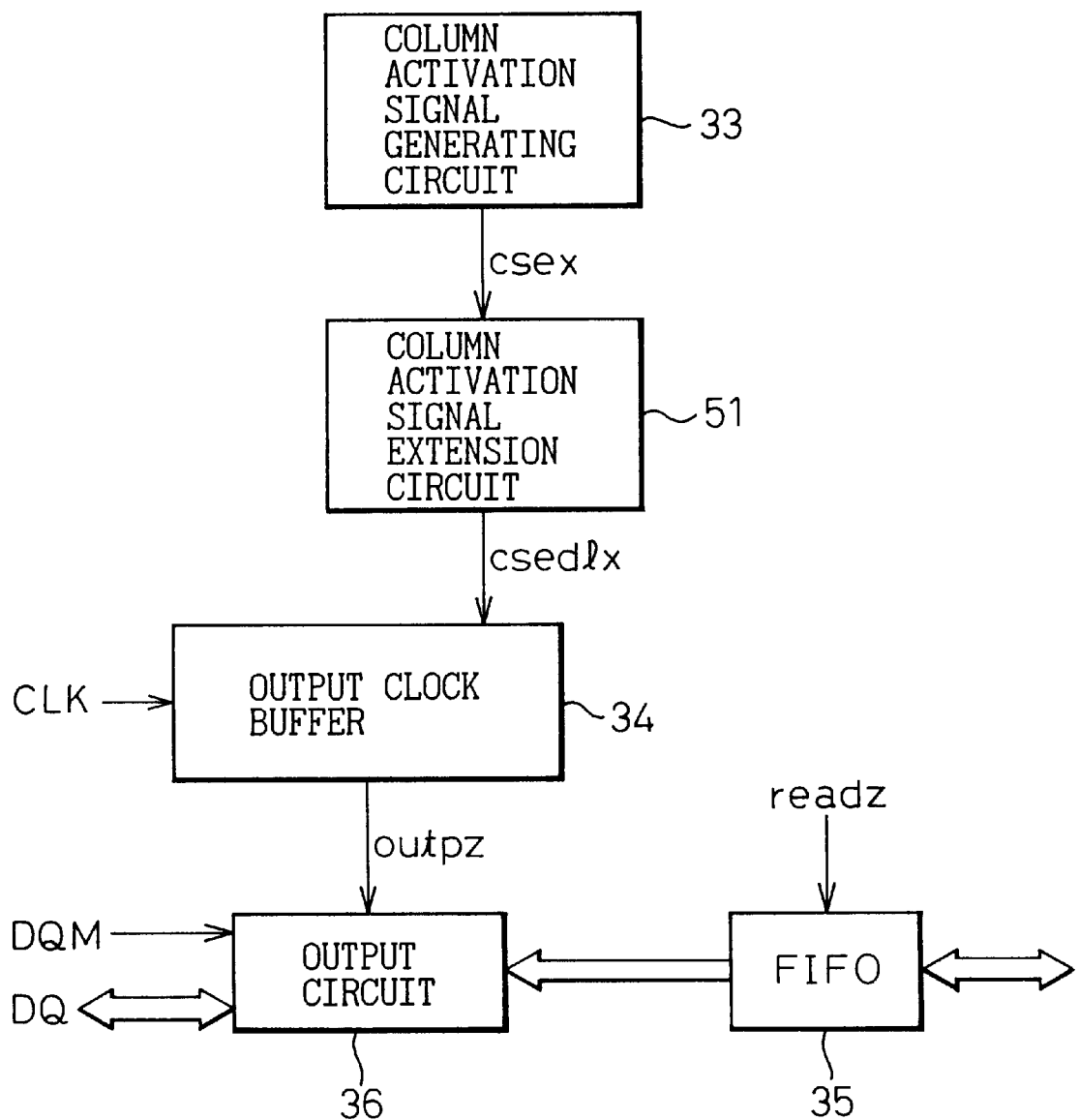
FIG. 10 is a block diagram showing a configuration according to a first embodiment of the invention.

FIG. 10 is a diagram showing a configuration of the parts related to the output of the SDRAM according to the first embodiment of the invention. The other parts have the same configuration as shown in FIG. 1.

Figure 1:
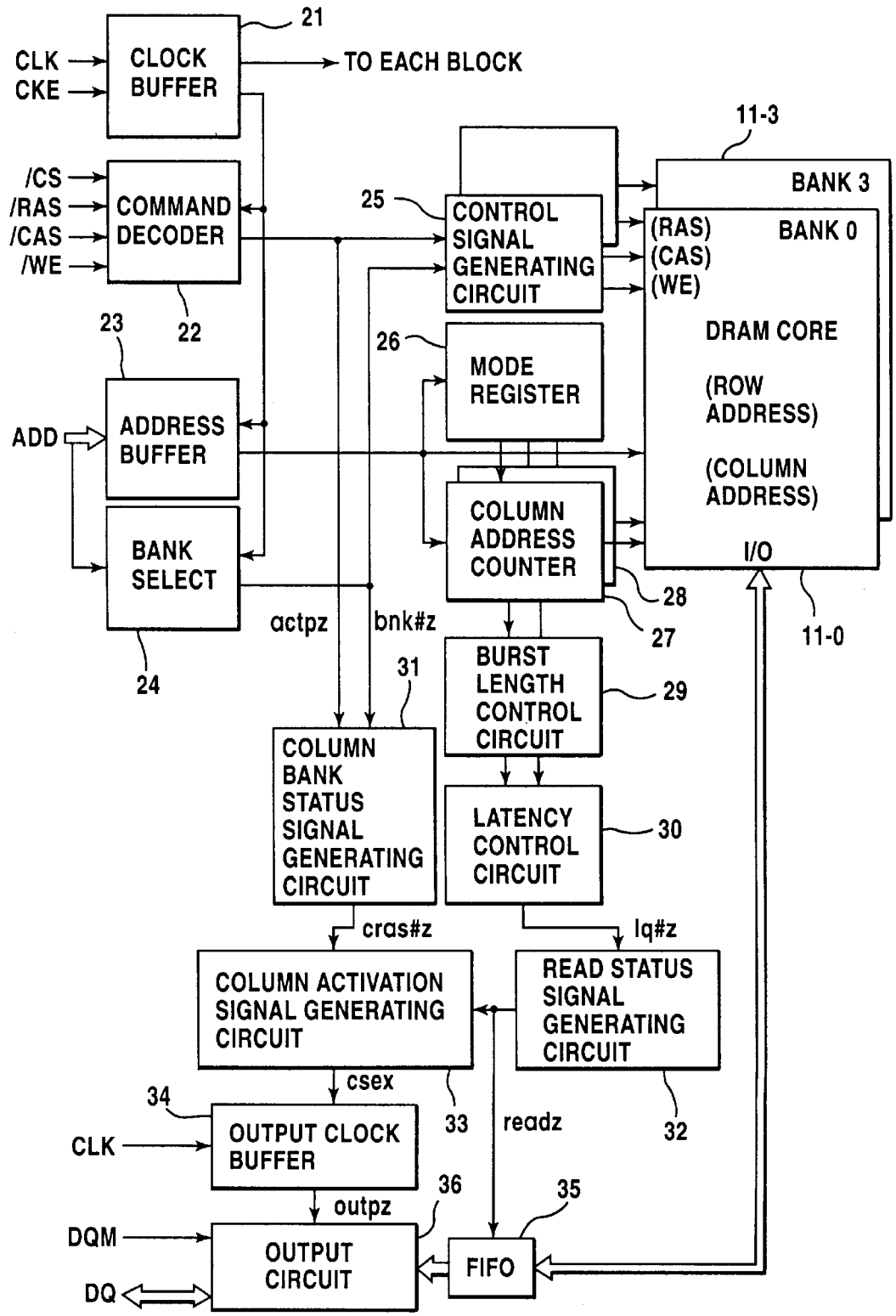
FIG. 1 is a block diagram showing a general configuration of a synchronous dynamic random access memory (SDRAM)
Figure 2:
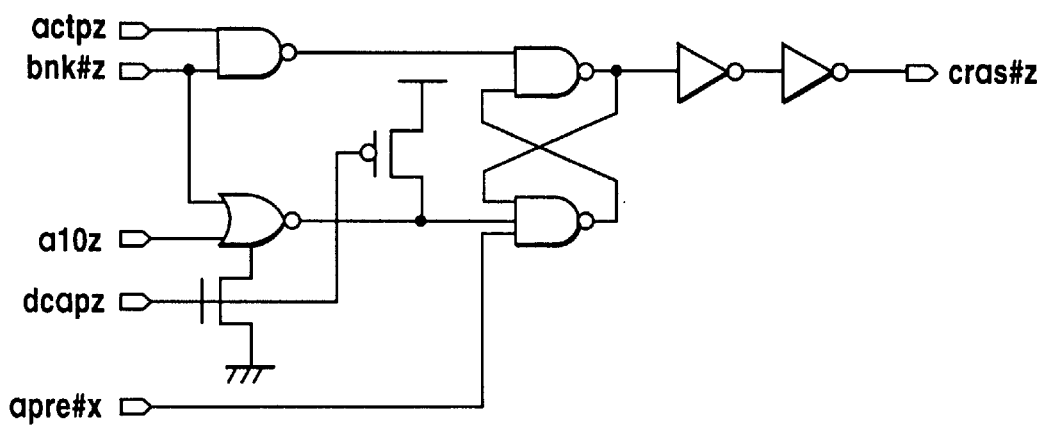
FIG. 2 is a circuit diagram of a column bank status signal generating circuit.
Figure 3:
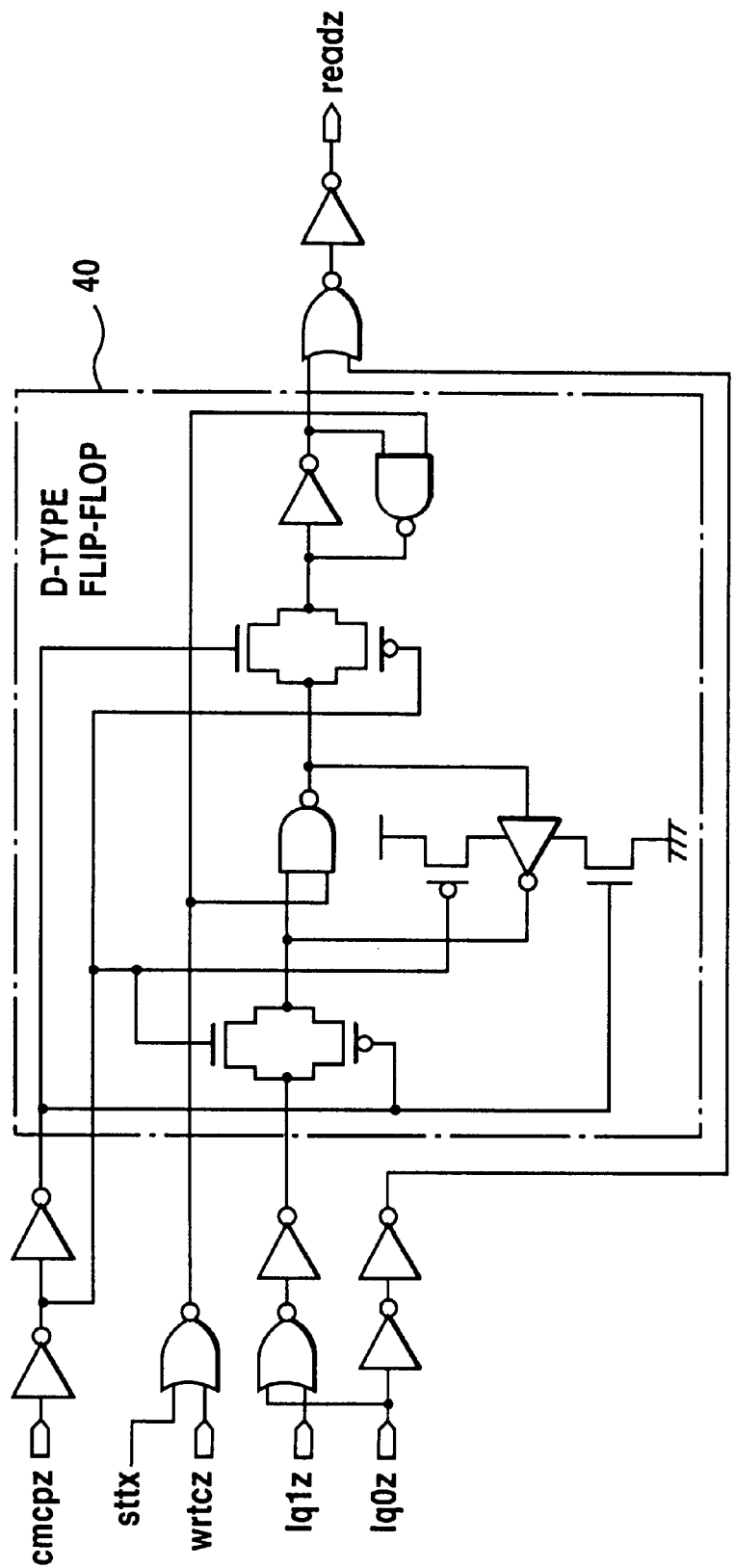
FIG. 3 is a circuit diagram of a read status signal generating circuit.
Figure 4:
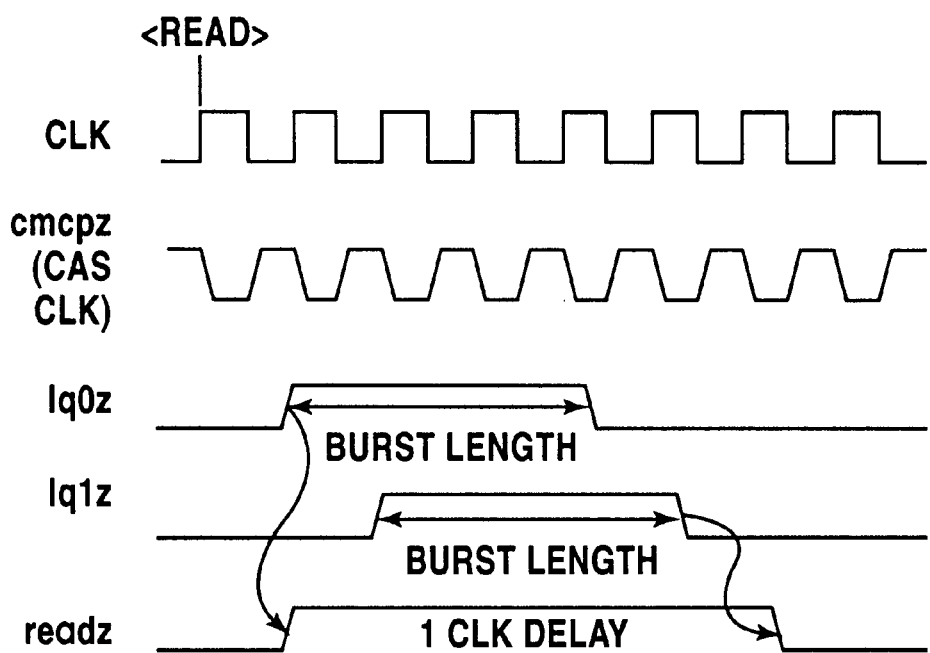
FIG. 4 is a time chart showing the operation of the read status signal generating circuit.
Figure 5:
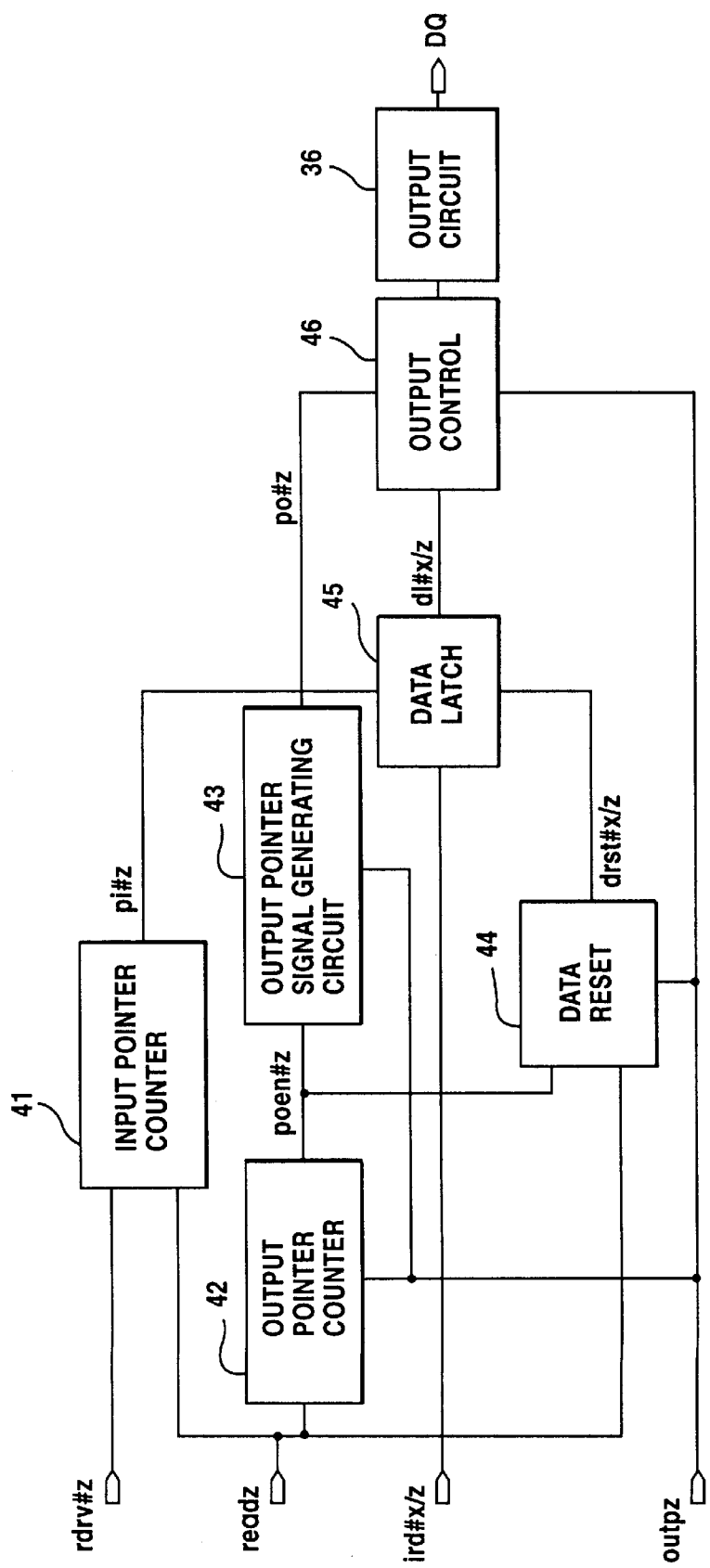
FIG. 5 is a circuit diagram of the FIFO circuit.
Figure 6:
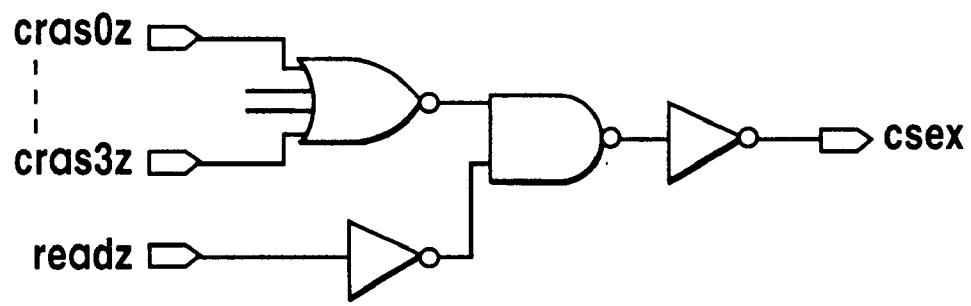
FIG. 6 is a circuit diagram of a column activation signal generating circuit.
Figure 7:
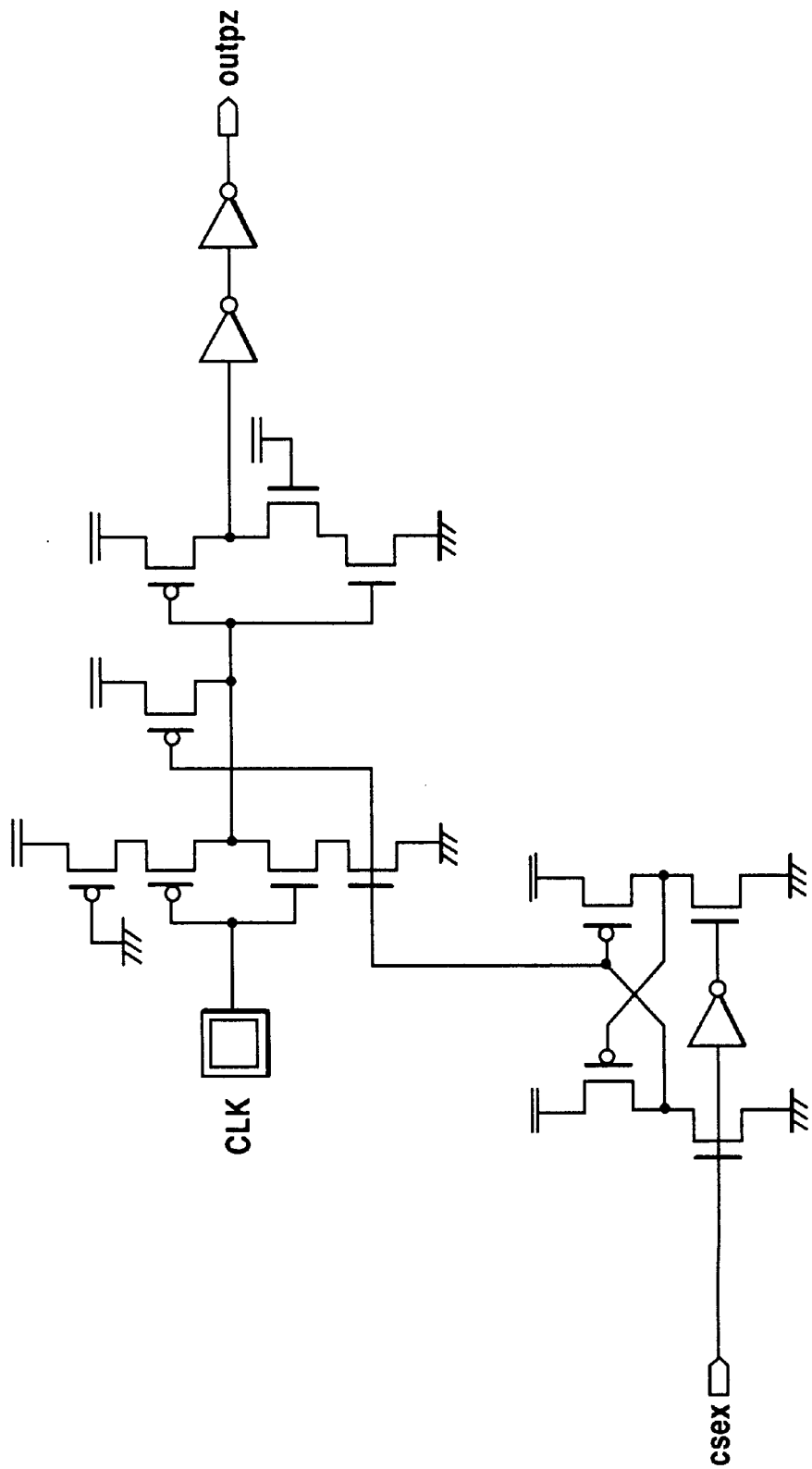
FIG. 7 is a circuit diagram of an output clock buffer.
Figure 8:
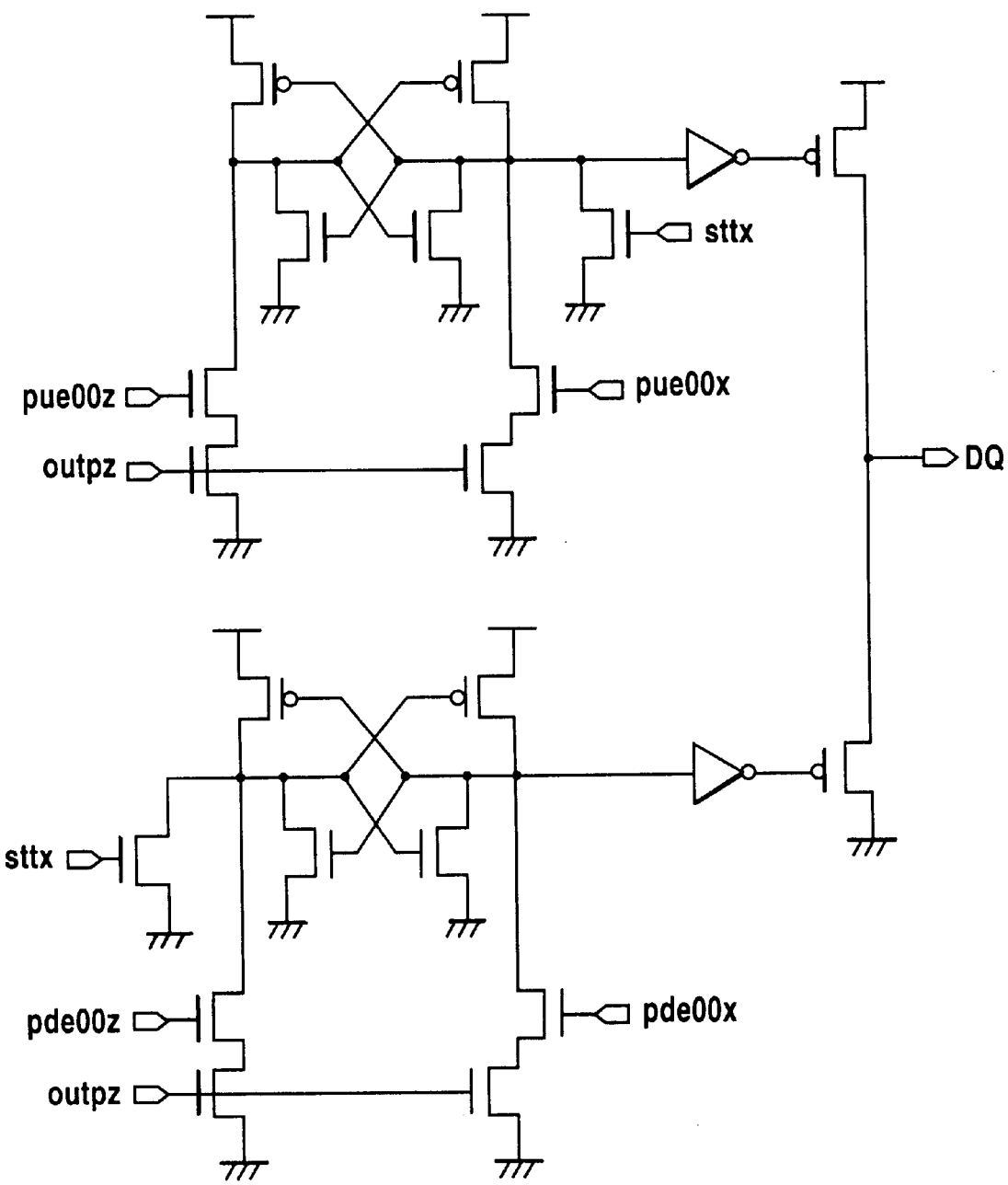
FIG. 8 is a circuit diagram of an output circuit.

As clear from comparison with FIG. 1, unlike in the prior art, a column activation signal extension circuit 51 is interposed between the column activation signal generating circuit 33 and a output clock buffer 34 for extending the column activation signal csex by one clock cycle to produce an extended column activation signal csedlx. The extended column activation signal csedlx is input to the output clock buffer 34 in place of the column activation signal csex. The other parts have the same configuration as the corresponding parts shown in FIG. 1.

Figure 11:
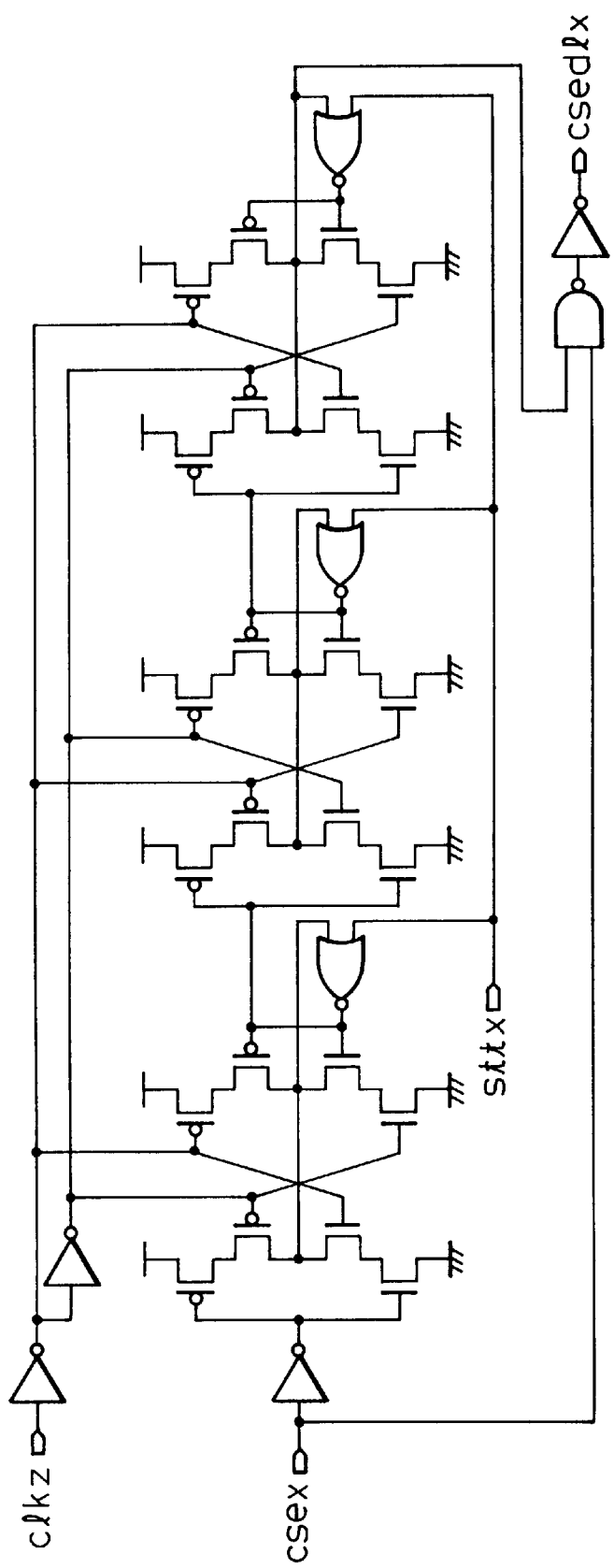
FIG. 11 is a circuit diagram of a column activation signal extension circuit according to an embodiment.

FIG. 11 is a diagram showing a configuration of the column activation signal extension circuit 51. In this circuit, the input column activation signal csex is delayed by one cycle of clock clkz using a flip-flop operated at the internal clock clkz, and synthesized with the signal csex thereby to generate the extended column activation signal csedlx. The signal csedlx is validated by falling the same way as the signal csex, and invalidated by rising one clock cycle behind.

Figure 9:
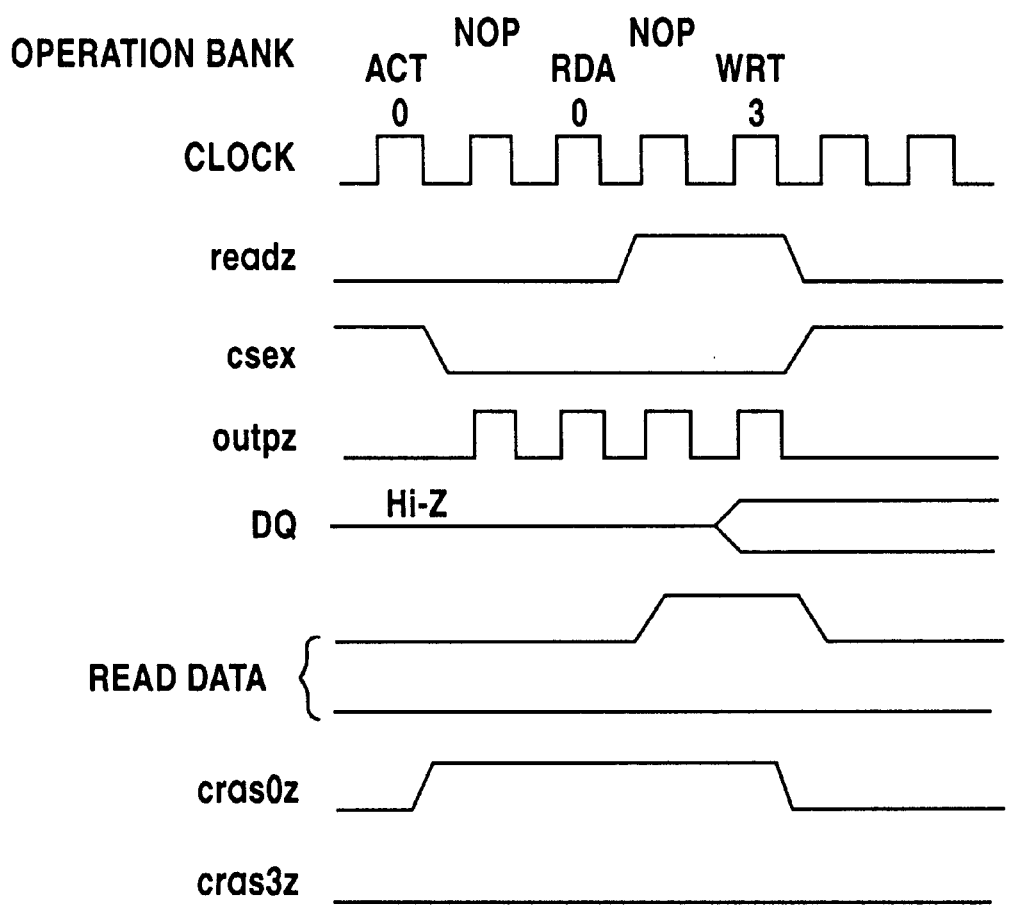
FIG. 9 is a time chart for explaining the problems occurred under abnormal conditions in the prior art.
Figure 12:
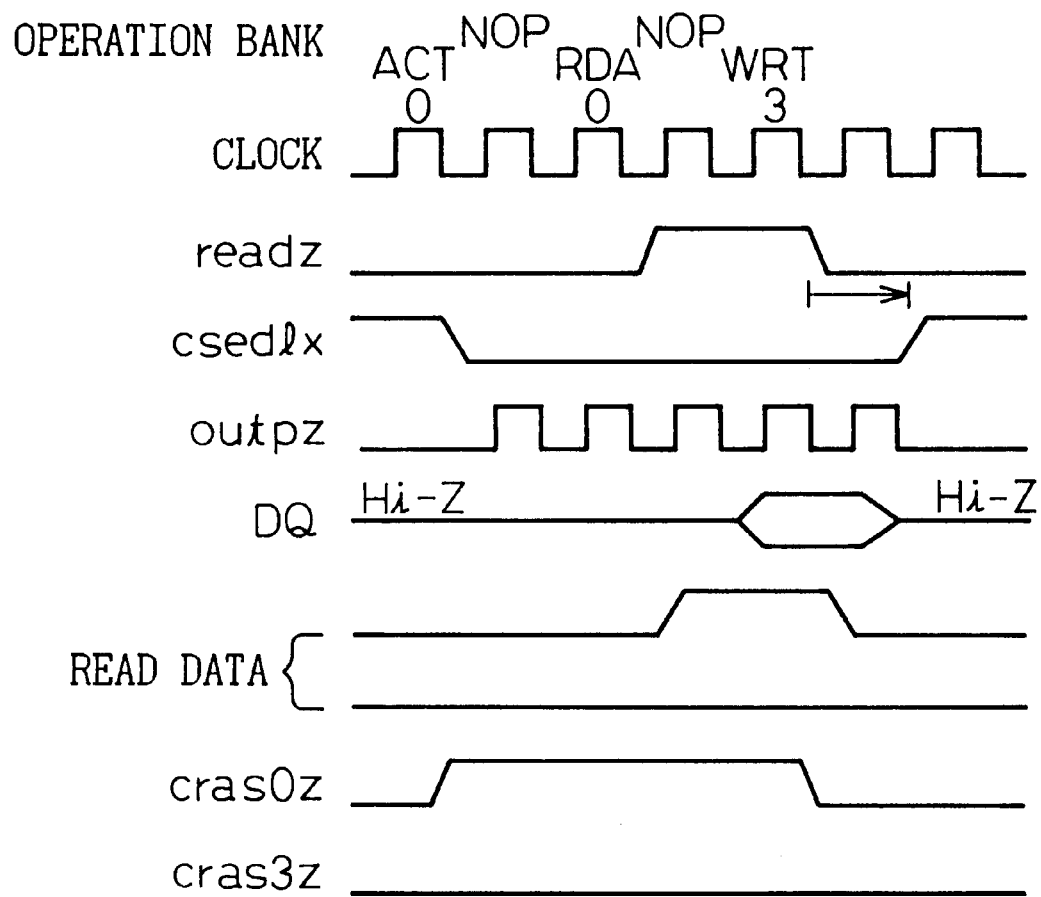
FIG. 12 is a time chart showing the operation of the first embodiment.

FIG. 12 is a time chart showing the operation according to the first embodiment, and corresponds to FIG. 9. As shown in FIG. 12, once a write command into the bank 3 is generated during the read operation, the read status signal readz falls to "low" while the column activation signal csex rises to "high" as in the prior art. The extended column activation signal csedlx, however, maintains a "low" state for an additional one cycle, and therefore one extra pulse of the output clock outpz is generated. Under this condition, the FIFO circuit 35 has high impedance data therein, which is set in the output circuit 36 by the last pulse of the signal outpz, so that the output DQ of the output circuit 36 assumes a high impedance.

According to the first embodiment, the column activation signal extension circuit 51 extends the column activation signal csex by one cycle of clock clkz. The extension can be further lengthened, however, in order to make sure that the output DQ assumes a high impedance without fail in case of a fault.

As shown in FIG. 9, the column activation signal csex is actually validated two cycles before the production of the output DQ, and the first two output clocks outpz are not actually used. Delaying the output clock outpz by one cycle, therefore, poses no problem. According to the second embodiment, this fact is utilized to assure that the output DQ assumes a high impedance with a simple circuit without fail even in case of a fault.

Figure 13:
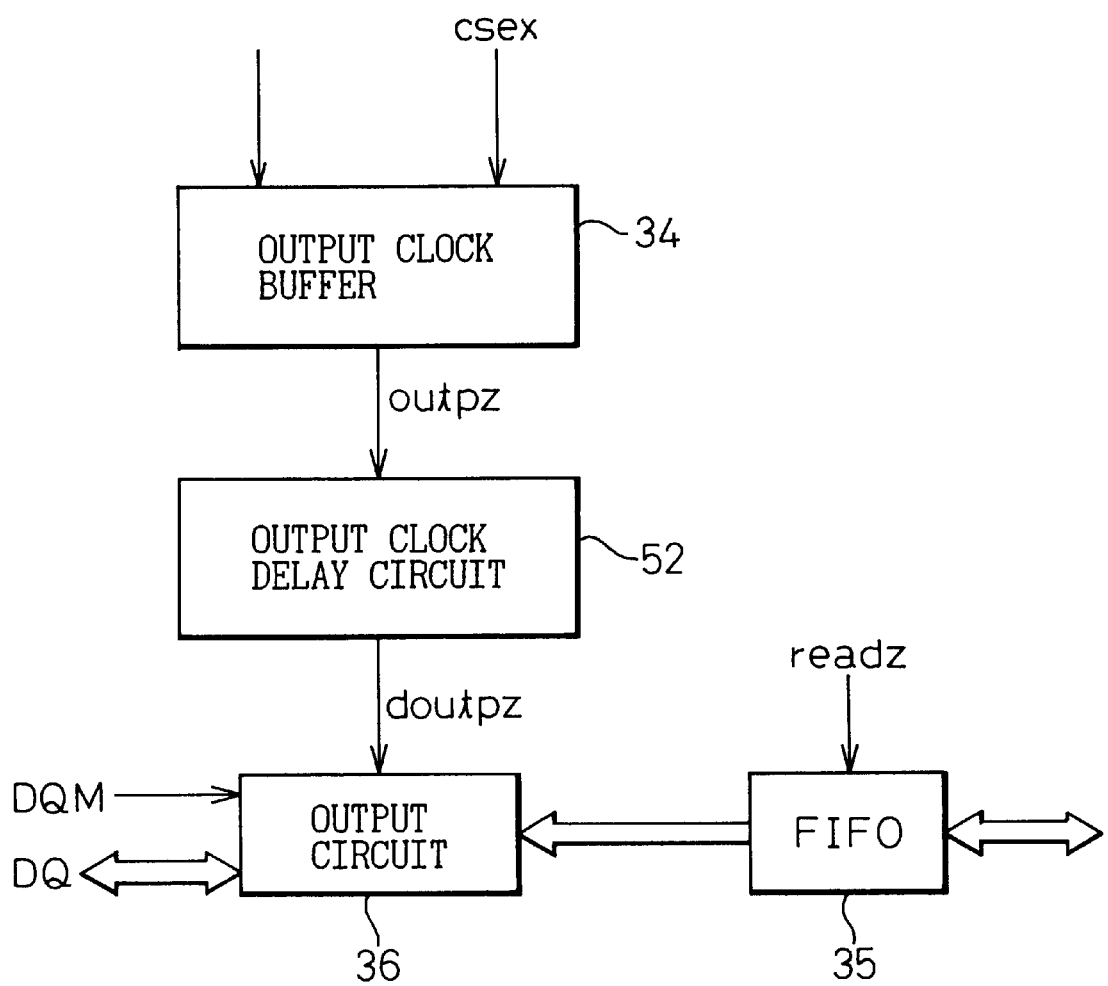
FIG. 13 is a block diagram showing a configuration according to a second embodiment of the invention.

FIG. 13 is a diagram showing a configuration of the parts related to the output of the SDRAM according to the second embodiment of the invention. The other parts are the same as the corresponding parts shown in FIG. 1.

As clear by comparison with the prior art, this embodiment is different from the prior art in that an output clock delay circuit 52 is added for delaying, by one cycle, the output clock outpz produced from the output clock buffer 34. The output clock delay circuit 52 produces a delayed output clock doutpz delayed by one cycle from the signal outpz. The output circuit 36 is supplied with the signal doutpz in place of the signal outpz, and the output changes in synchronism with the signal doutpz. The signal doutpz is one cycle delayed behind the signal outpz, and therefore this circuit has substantially the same effect as producing one more extra pulse of the output clock. As a result, as explained with reference to FIG. 12, even when a write command into the bank 3 occurs during the read operation, the high impedance data is set in the output circuit 36 by the last pulse, so that the output DQ of the output circuit assumes a high impedance. As described above, the first two pulses of the output clock outpz are not actually used, and therefore this delay has no adverse effect on the start of the output.

It will thus be understood from the foregoing description that, according to the present invention, even in the case where an abnormal command is input or at the time of turning power on, the output of the output circuit can be made to assume a high impedance without fail while at the same time increasing the current consumption only slightly.

What is claimed is:

1. A semiconductor memory device having an data output terminal for outputting data in synchronism with a clock, comprising:

an output clock generating circuit for generating an output clock in accordance with an output period for the data; and an output circuit for producing the output data in accordance with said output clock;

wherein said output clock generating circuit is turned off after generating said output clock for two extra cycles following the end of the production of the data.

2. A semiconductor memory device according to claim 1, further comprising:

a read status signal generating circuit for generating a read status signal of which the end time point of the period corresponding to the output period for said data is extended by one clock cycle;

a FIFO circuit for temporarily holding the data as long as said read status signal is valid, applying said data to said output circuit, and then producing a high impedance data to change said output circuit into a high impedance state; and an activation signal generating circuit for generating an activation signal of which the end time point is extended by one clock cycle from the output period of said data, as in said read status signal, based on said access signal to an memory cells of said semiconductor memory device and said read status signal.

3. A semiconductor memory device according to claim 2, wherein said output clock generating circuit includes an extension circuit for extending said activation signal by at least another one extra clock cycle, and wherein said output clock continues to be generated as long as the output of said extension circuit remains valid.

4. A semiconductor memory device according to claim 2, wherein said output clock generating circuit includes a clock generating circuit for generating said output clock as long as said activation signal remains valid, and a delay circuit for delaying said output clock by at least one cycle, wherein the output of said delay circuit is supplied to said output circuit as said output clock.

5. A semiconductor memory device according to claim 2, wherein said semiconductor memory device is a synchronous dynamic random access memory (SDRAM) having a plurality of banks of memory cells, and wherein said access signal is a bank activation signal for accessing any one of said plurality of banks.

* * * * *